US011119136B1

(12) United States Patent
Tsironis

(10) Patent No.: US 11,119,136 B1
(45) Date of Patent: Sep. 14, 2021

(54) MULTI-OCTAVE HYBRID HARMONIC LOAD PULL TUNER

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 18 days.

(21) Appl. No.: 16/445,646

(22) Filed: Jun. 19, 2019

(51) Int. Cl.
*G01R 27/06* (2006.01)
*G01R 1/067* (2006.01)
*G01R 27/32* (2006.01)

(52) U.S. Cl.
CPC ......... *G01R 27/06* (2013.01); *G01R 1/06772* (2013.01); *G01R 27/32* (2013.01)

(58) Field of Classification Search
CPC ..... G01R 27/06; G01R 27/32; G01R 1/06772
See application file for complete search history.

(56) References Cited

U.S. PATENT DOCUMENTS

| 5,276,411 | A | 1/1994 | Woodin et al. | |
|---|---|---|---|---|
| 6,980,064 | B1* | 12/2005 | Boulerne | H01P 5/04 333/17.3 |
| 7,135,941 | B1 | 11/2006 | Tsironis | |
| 7,282,926 | B1 | 10/2007 | Verspecht et al. | |
| 8,841,921 | B1 | 9/2014 | Tsironis | |
| 9,921,253 | B1 | 3/2018 | Tsironis | |
| 2007/0171008 | A1* | 7/2007 | Boulerne | G01R 1/26 333/263 |
| 2013/0234741 | A1* | 9/2013 | Mow | H01Q 9/42 324/750.01 |
| 2013/0321092 | A1* | 12/2013 | Simpson | G01R 27/00 333/17.3 |
| 2017/0141802 | A1* | 5/2017 | Solomko | G01R 27/06 |

OTHER PUBLICATIONS

Load Pull, online, Wikipedia [Retrieved on Nov. 18, 2016]. Retrieved from Internet <URL: http://en.wikipedia.org/wiki/Load_pull>.
"Computer Controlled Microwave Tuner, CCMT", Product Note 41, Focus Microwaves Inc., Jan. 1998, pp. 2-4.
"MPT, a universal Multi-Purpose Tuner", Product Note 79, Focus Microwaves, Oct. 2004.
Takayama, Y. "A new load-pull characterization method", 1976 IEEE-MTT—Symposium, pp. 218-220.
Power dividers and directional couplers [online], Wikipedia [retrieved on Sep. 2, 2016]. Retrieved from Internet <URL: https://en.wikipedia.org/wiki/Power_dividers_and_directional_couplers>.
Circulators [online], Wikipedia [retrieved on Sep. 2, 2016]. Retrieved from Internet <URL: https://en.wikipedia.org/wiki/Circulator>.

(Continued)

*Primary Examiner* — Akm Zakaria

(57) ABSTRACT

A multi-octave hybrid harmonic load pull tuner comprises a slabline with an adjustable signal coupler (wave-probe) and two multi-carriage slide screw tuners, one in the feedback signal injection loop and one as a pre-matching transformer. The wave-probe controls the static amplitude and phase of the feedback signal and the harmonic tuner in the loop controls the actual amplitude and phase of the re-injected signal at each harmonic frequency separately. De-embedding fast calibration and search routines allow identifying tuner states satisfying instantaneously impedance targets over the entire harmonic spectrum.

8 Claims, 13 Drawing Sheets

(56) References Cited

OTHER PUBLICATIONS

Broadband RF & Microwave Amplifiers [online], SHF Communication Technologies AG [retrieved on Jun. 13, 2019]. Retrieved from Internet <URL: https://www.shf-communication.com/products/rf-broadband-amplifiers/>.

What is a Triplexers ? [online], everything RF [retrieved on Jun. 13, 2019]. Retrieved from Internet <URL : https://www.everythingrf.com/community/what-is-a-triplexer>.

What is a Vector Network Analyzer, VNA: the basics [online], electronics notes, [retrieved on Jun. 13, 2019]. Retrieved from Internet <URL: https://www.electronics-notes.com/articles/test-methods/rf-vector-network-analyzer-vna/what-is-a-vna.php>.

Conversion S-Parameters to Y-Parameters [online], Spectrum Software [retrieved on Jun. 13, 2019]. Retrieved from Internet <URL: https://www.spectrum-soft.com/news/ winter2001/conv_spar.shtm>.

\* cited by examiner

MULTI-OCTAVE HYBRID HARMONIC LOAD PULL TUNER

PRIORITY CLAIM

Non applicable.

CROSS-REFERENCE TO RELATED ARTICLES

1. Load Pull [online], Wikipedia [retrieved 2016-11-18]. Retrieved from Internet <URL: http://en.wikipedia.org/wiki/Load_pull>.
2. "Computer Controlled Microwave Tuner, CCMT", Product Note 41, Focus Microwaves Inc. 1998, pages 2-4.
3. "MPT, a universal Multi-Purpose Tuner", Product Note 79, Focus Microwaves, October 2004
4. Takayama, Y. "A new load-pull characterization method", 1976 IEEE-MTT-Symposium, pp 218-220.
5. Simpson, G., US patent application 2013/0321092, "Hybrid active tuning system and method", US 2013/0321092, FIGS. 9, 16, 18.
6. Tsironis, C., U.S. Pat. No. 9,921,253, "Method for reducing power requirements in active load pull system".
7. Verspecht et al. U.S. Pat. No. 7,282,926, "Method and an apparatus for characterizing a high-frequency device-under-test in a large signal impedance tuning environment".
8. Power dividers and directional couplers [online], Wikipedia [retrieved on 2016 Sep. 2]. Retrieved from Internet <URL: https://en.wikipedia.org/wiki/Power_dividers_and_directional_couplers>.
9. Circulators [online], Wikipedia [retrieved on 2016 Sep. 2]. Retrieved from Internet <URL: https://en.wikipedia.org/wiki/Circulator>.
10. Broadband RF & Microwave Amplifiers [online], SHF Communication Technologies AG [retrieved on 2019 Jun. 13]. Retrieved from Internet <URL: https://www.shf-communication.com/products/rf-broadband-amplifiers/>.
11. Woodin C. et al., U.S. Pat. No. 5,276,411, "High power solid state programmable load"
12. What is a Triplexers ? [online], everything RF [retrieved on 2019 Jun. 13]. Retrieved from Internet <URL: https://www.everythingrf.com/community/what-is-a-triplexer>.
13. Simpson, G., US patent application 2013/0321092 "Hybrid active tuning system and method", FIG. 5, items 76, 78.
14. Simpson, G., US patent application 2013/0321092 "Hybrid active tuning system and method", FIG. 17, item 252 and Column 5 paragraph [071], lines 7-9.
15. What is a Vector Network Analyzer, VNA: the basics [online], electronics notes, [retrieved on 2019 Jun. 13]. Retrieved from Internet <URL: https://www.electronics-notes.com/articles/test-methods/rf-vector-network-analyzer-vna/what-is-a-vna.php>.
16. Tsironis, C,. U.S. Pat. No. 7,135,941, "Triple probe automatic slide screw tuner".
17. Conversion S-Parameters to Y-Parameters [online], Spectrum Software [retrieved on 2019 Jun. 13]. Retrieved from Internet <URL: https://www.spectrum-soft.com/news/winter2001/conv_spar.shtm>.
18. Tsironis C., U.S. Pat. No. 8,841,921, "Adjustable Signal Sampling Sensor and Method", column 5, lines 1-57.

BACKGROUND OF THE INVENTION AND PRIOR ART

This invention relates to "controlled non-50Ω" (Load Pull) testing of microwave devices and transistors (DUT) (see ref. 1). Load pull is the method by which the load impedance presented to the DUT at a given frequency is changed systematically and the DUT performance is registered, with the objective to find an optimum, depending on the overall design objectives. This may be maximum power, efficiency, linearity or else. The impedance is controlled using impedance tuners (see ref. 2).

A load pull test system is shown in FIG. 1. It comprises a signal source, source and load impedance tuners, a device under test (DUT, transistor) in a test fixture (the DUT can also be a micro-chip on a semiconductor wafer accessed using microscopic wafer probes) and input and output measurement instruments. The instruments can measure power, DC bias and various spectral components, generated either by the source or by the non-linearities of the DUT. The tuners and the instruments are controlled by a PC controller (not shown) using test software and appropriate digital communication protocols (GPIB, RS 232, LAN etc.). The data acquired by the test software comprise RF and DC response of the DUT to input stimulus for given source and load impedances. This data is saved in load pull files and serve to a) qualify the DUT and b) design optimum matching networks for given target performance, this being output power, linearity, efficiency etc.

Passive slide-screw tuners (see ref. 2) are used in the industry for non-50Ω measurements. They use a low loss slotted airline (slabline) and metallic, wideband reflective probes insertable into the slabline channel, coupled capacitively with the center conductor and moved in-out and along the slabline to create an amplitude and phase controllable reflection factor. Those tuners have, frequency dependent, the inherent limitation of up to a maximum reflection factor $|\Gamma|<0.95$ at the tuner reference plane; transferred to the DUT reference plane the reflection factor is lower, due to interfering adapter, cable and test fixture insertion loss. Beyond this limitation, multi-probe electro-mechanical tuners can control, over multiple frequency octaves the reflection factor at least at three harmonic frequencies independently (see ref. 3). To overcome the tuning range limitation of the magnitude of the reflection factor at the DUT reference plane, the only alternative is using active tuners (see ref. 4). However, active tuners are mostly limited to fundamental frequency (Fo) operation. To make active tuners with harmonic impedance control one must use additional external signal sources, a cumbersome and expensive solution (see ref. 5). Active tuners use amplifiers to enhance and re-inject coherent signal into the DUT; amplifiers have, typically a 50Ω internal impedance; this creates a large power mismatch with the low impedance of the DUT (1-2Ω) and requires pre-matching techniques (see ref. 6) leading to hybrid (active plus passive) tuning solutions.

BRIEF SUMMARY OF THE INVENTION

This invention discloses a wideband (multi-octave frequency) hybrid (active plus passive) tuner (FIG. 2) overcoming the above shortcomings: a) it uses active loop injection to overcome the tuning range limitation; b) it uses wideband multi-carriage harmonic tuners and wideband amplifiers (see ref. 10) to create harmonic feedback injection and power pre-matching control; it also uses c) ultra-wideband signal combiners/dividers (see ref. 8), instead of octave-frequency band limited circulators (see ref. 9), to direct and recover the amplitude and phase controlled feedback signal. The use, as an alternative, of adjustable wave-probe signal coupler to sample the signal for the active feedback loop adds a useful degree of freedom to direct the active tuning towards the area of best performance of the DUT and optimize the amount of sampled signal power and gain of the loop. Multi-octave, closed loop hybrid (active-passive) harmonic tuners have not been reported before. Alternative solutions, based on the same general concept, use narrowband electronic tuners (see ref. 11), triplexers (see ref. 12) or octave frequency-band limited circulators. The proposed tuner covers several octaves, like 0.8-18 GHz, 2-30 GHz (4 octaves) or higher.

DETAILED DESCRIPTION OF THE DRAWINGS

The invention and its mode of operation will be better understood from the following detailed description when read with the appended drawings in which.

DETAILED DESCRIPTION OF THE INVENTION

Figure 1:
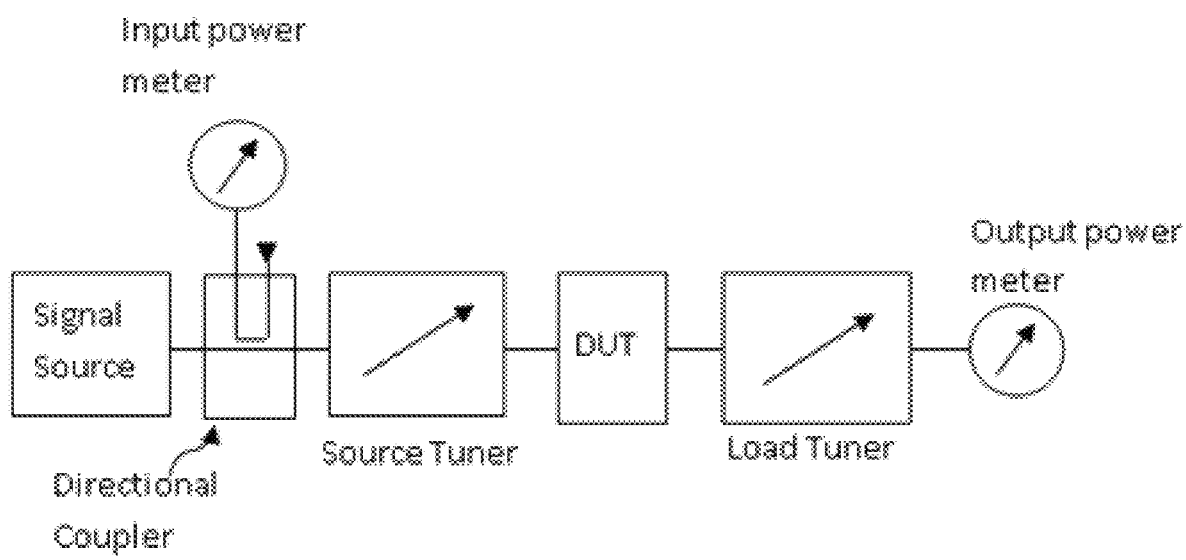
FIG. 1 depicts prior art, a typical scalar load pull test system using passive tuners.
Figure 2:
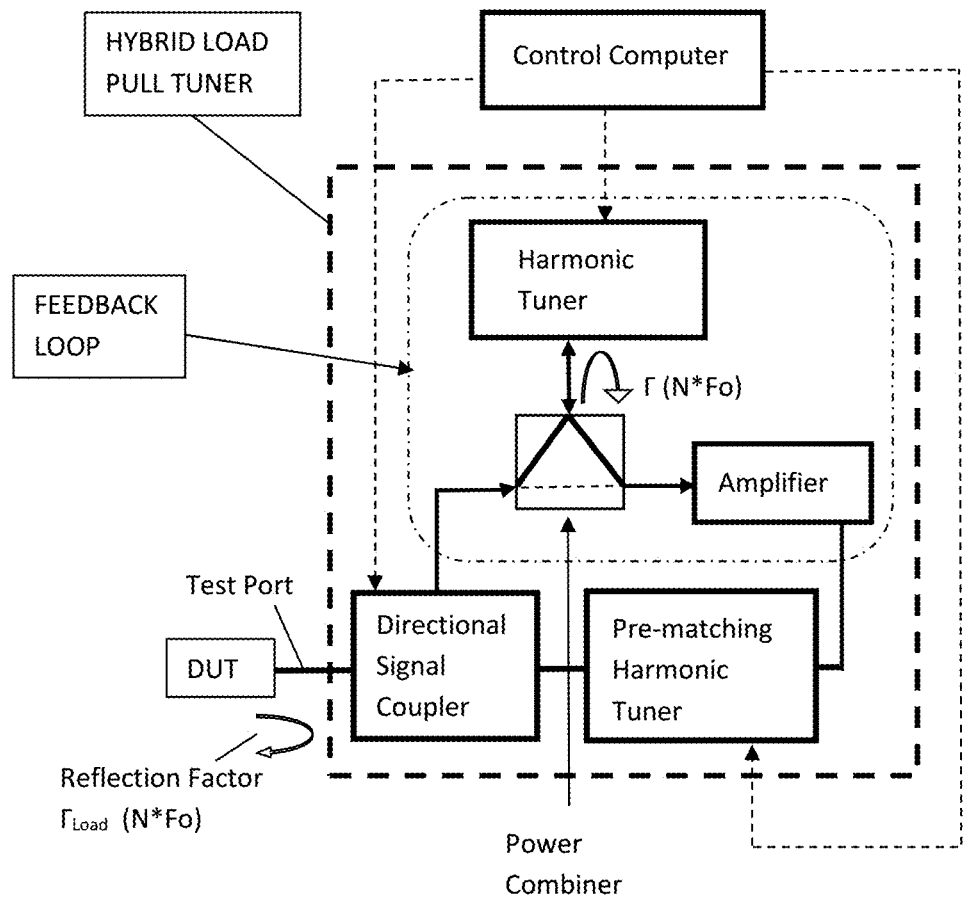
FIG. 2 depicts the basic configuration of the hybrid multi-octave load pull tuner.

The concept of the tuner is shown in FIG. 2: Signal coming from the DUT (typically including harmonics 2Fo and 3Fo) enters the hybrid load pull tuner at the test port. Part of the signal is coupled into the feedback loop, amplitude and phase controlled at all harmonic frequencies independently, amplified and re-injected back into the DUT creating a controlled reflection factor $\Gamma_{Load}(N^*Fo)$, N=1, 2, 3 . . . . A pre-matching harmonic tuner ensures optimum power transfer between the amplifier and the DUT at all harmonic frequencies. Feedback harmonic signal control occurs using injection and reflection into the input port of a multi harmonic tuner using a wideband power combiner. Both tuners and, if used, the adjustable coupler, are controlled by a control computer using appropriate control interface and software.

Figure 3:
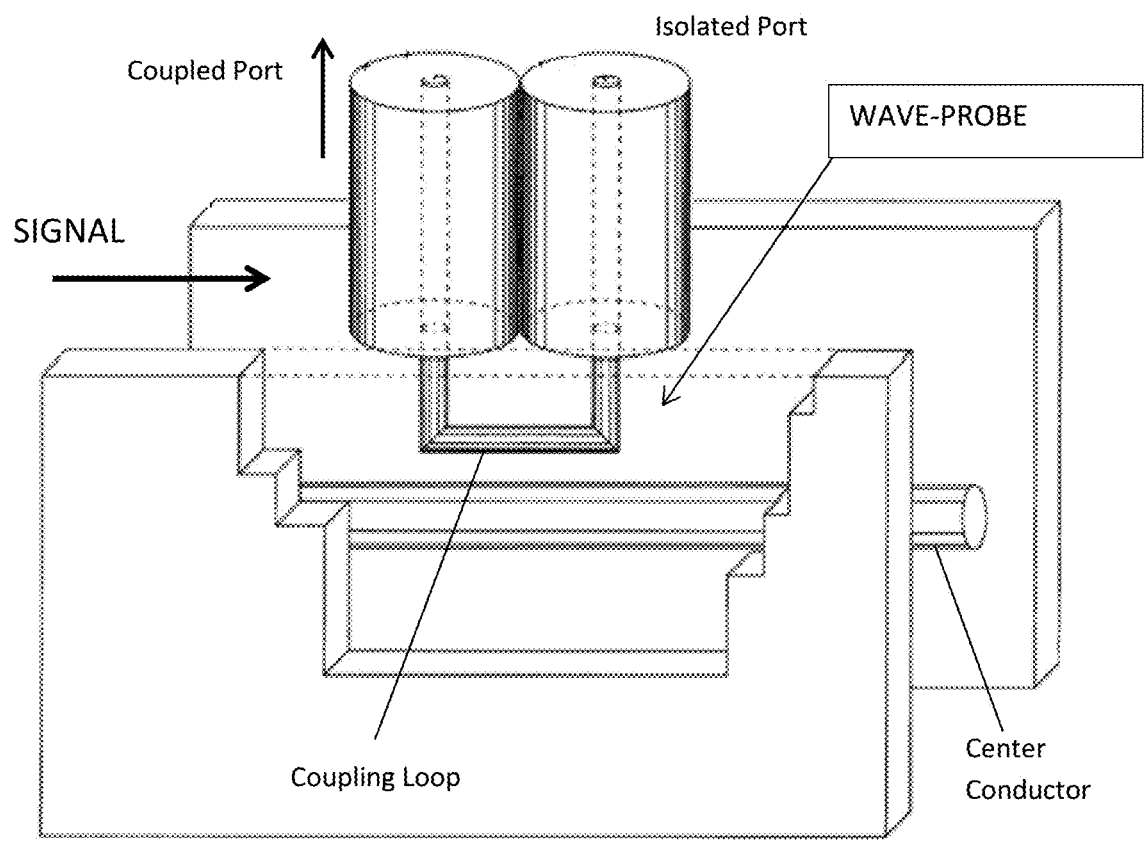
FIG. 3 depicts prior art, the perspective 3D view of a cut through a "wave-probe" type signal coupler.
Figure 4:
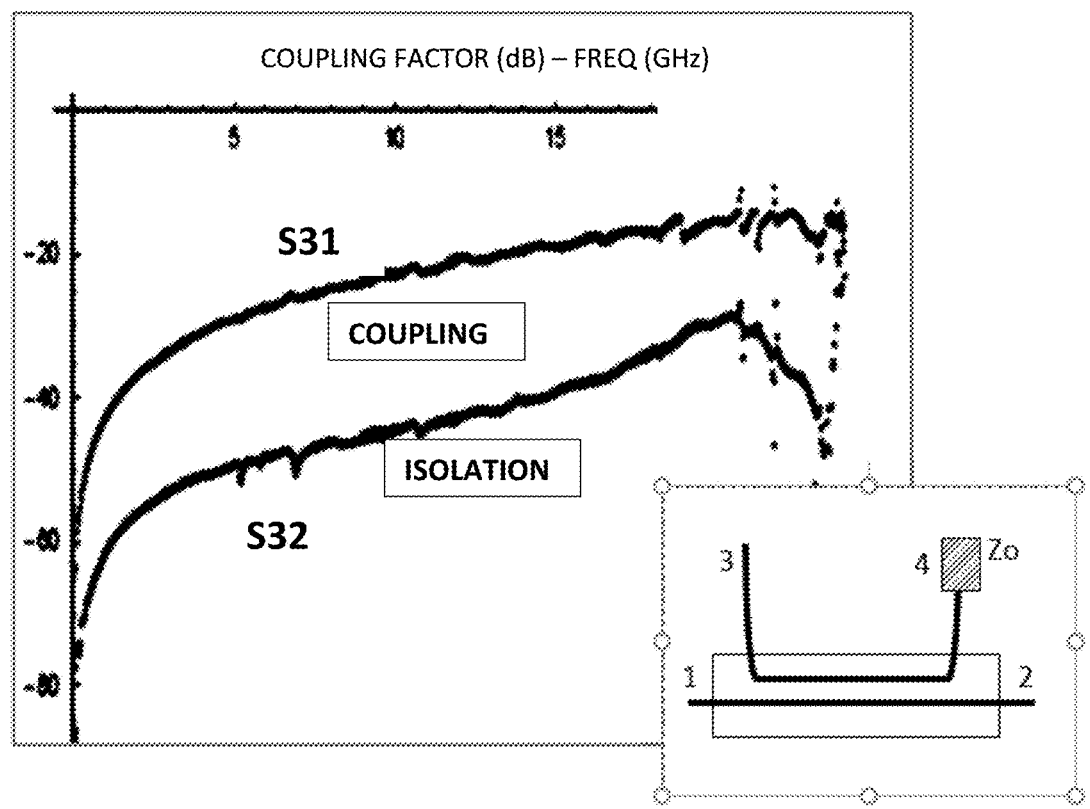
FIG. 4 depicts prior art, measured coupling (S31) and isolation (S32) of a wave-probe and associated port definitions.

The basic structure and typical performance of the adjustable coupler (wave-probe) are shown in FIGS. 3 and 4, see ref. 7. An inherent advantage of such coupler is the increasing coupling factor with frequency, translating in more power coupled at the lower power harmonic components, thus acting as an equalizer.

Figure 5:
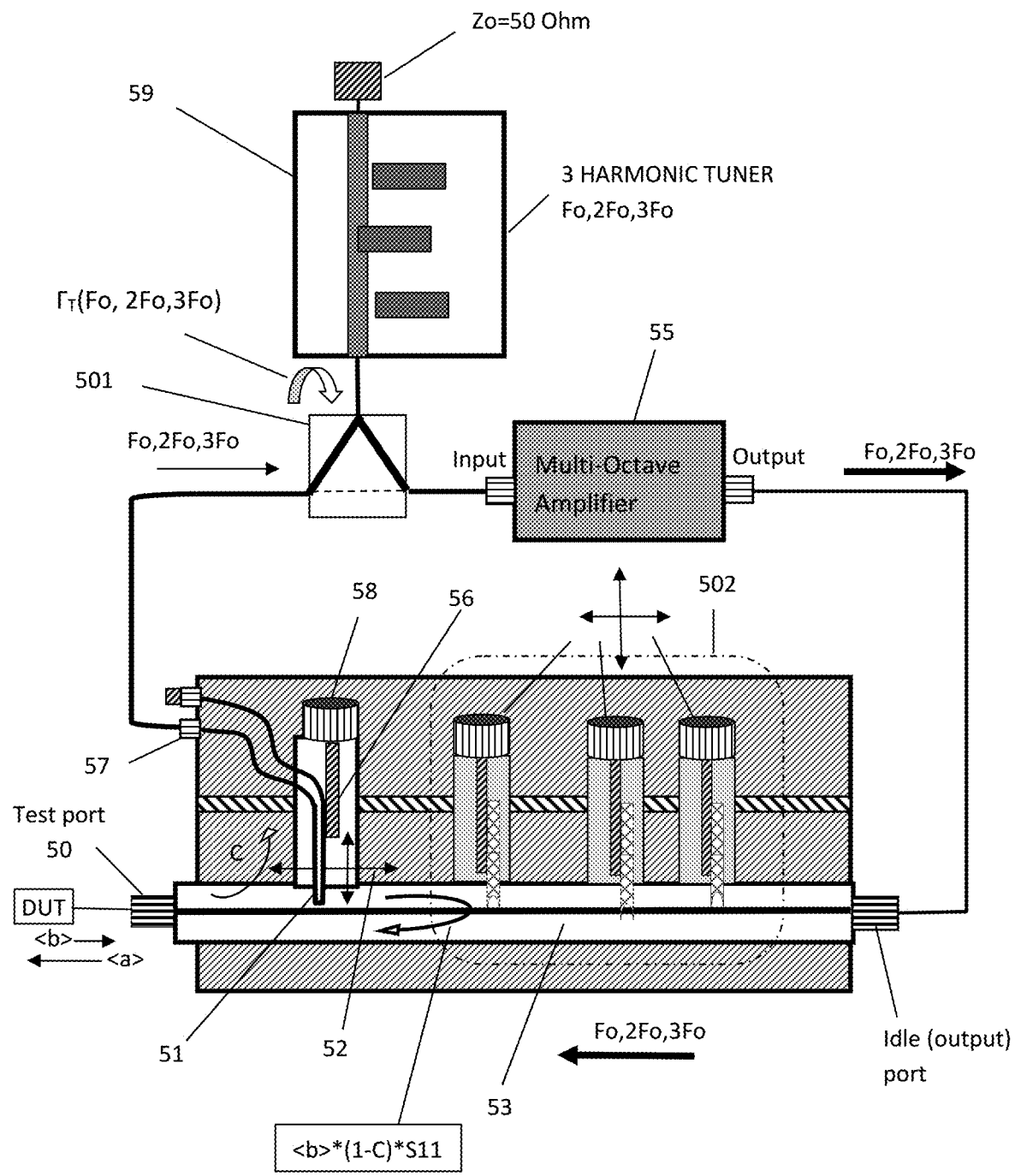
FIG. 5 depicts detailed structure of the hybrid multi-octave load pull tuner.
Figure 9:
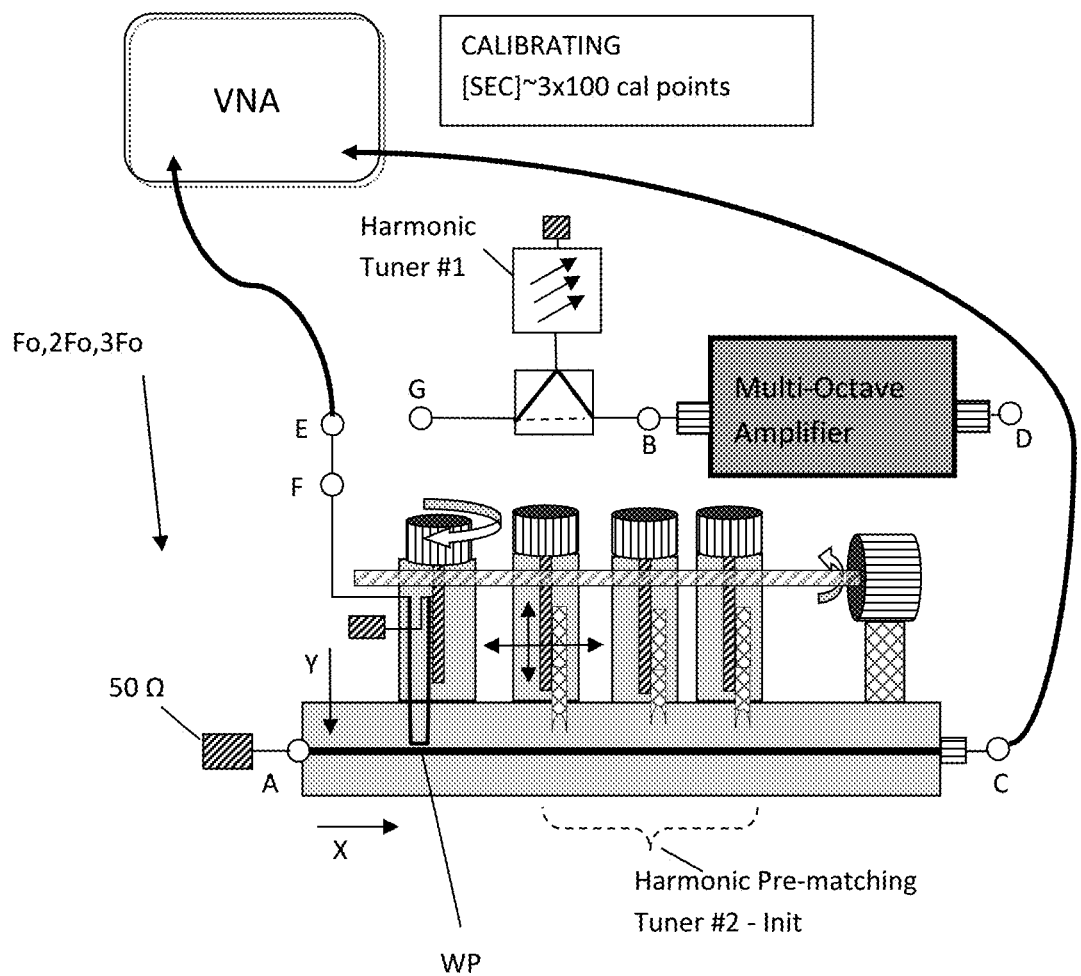
FIG. 9 depicts setup for calibration of isolation path of adjustable signal coupler (wave-probe).

In more detail the actual basic embodiment of the invention is shown in FIG. 5: The DUT is connected to the tuner at the test port 50; the active tuner comprises a slabline 53, a wave-probe 51 inserted into the slot of the slabline and attached on the vertical axis of a mobile carriage that slides 52 along the slabline. The vertical axis 56 is remotely controlled using a stepper motor 58 and electronic control; the signal extracted 57 from the slabline by the wave-probe is injected into the test port of a multi-carriage electromechanical harmonic tuner 59 (see ref. 3) via a power combiner/divider 501 (FIG. 9) of which the common port is connected to the tuner 59, the first secondary port is connected to the coupled port 57 of the wave-probe 51 and the second secondary port of the combiner is connected to the input port of the power amplifier 55. The output port of the amplifier 55 is connected with the output port of the slabline. The slabline serves as main body of a multi-carriage harmonic pre-matching slide screw tuner 502 improving the transfer of power from the amplifier to the DUT (see ref. 6).

In terms of signal flow: The signal exiting the DUT from its output port enters the tuner into the test port 50; it is then sampled by wave-probe 51, of which the coupling factor C is adjustable by inserting the coupling loop (FIG. 3) into the slabline 53 via the vertical axis 56 of a mobile carriage, controlled either manually or remotely by a vertical motor 58. The signal transfer from coupled port 57 occurs via a wideband signal combiner/divider 501 through injection into one of the two secondary ports of the combiner. The common port of the combiner is connected with the input port of the harmonic tuner 59, of which the output port is terminated with 50Ω (the typical characteristic impedance of the tuner airline). The signal is reflected on the tuner input port by the tuner reflection factor $\Gamma_T(N^*Fo)$ and is forwarded, with user-modified amplitude and phase, to the secondary ports of the combiner. Half of it is injected into the power amplifier 55. Traversing this path the tuner 59 reflection factor becomes a harmonic amplitude and phase-controlled feedback loop transmission. From there the signal is injected back into the output port of the slabline and continues to the DUT after being pre-matched at all harmonics using the harmonic impedance tuner 502. The returned signal arrives at the DUT port and creates a virtual reflection factor $\Gamma$ at all 3 harmonic frequencies Fo, 2Fo and 3Fo: $\Gamma_{load}(N^*Fo)$. Depending on amplitude and relative phase of the returning signal a controllable reflection factor $\Gamma_{load}=<a>/<b>$ is generated at the test port 50, at each harmonic frequency, which, due to the amplification G of the active part of the signal, can reach $|\Gamma_{load}|\geq 1$ at the test port 50 or even $|\Gamma_{load}|=1$ at an internal DUT reference plane, which lies beyond the test port, despite the intervening insertion loss of a test fixture, housing the DUT.

A simplified calculation, FIG. 5, assuming the coupling factor of the coupler being C, the combiner common to secondary ports transmission being Scs, the amplifier gain being G and the pre-matching tuner s-parameters being Sij, whereby the input and output impedance of the amplifier is assumed to be 50Ω, meaning that the pre-matching tuner reflection factor towards the DUT becomes S11, yields: $<a(N*Fo)>=<b(N*Fo)>*\{C*S_{SC}^2*\Gamma_T*G*(1-S22^2)/S21^2+(1-C)*S11\}$. Hereby all quantities are frequency dependent and shall be considered for F=N*Fo with N=1, 2, 3. And by consequence $\Gamma_{load}=\{C*S_{SC}^2*\Gamma_T*G*(1-S22^2)/S21^2+(1-C)*S_{11}\}$. {eq.1}

It is obvious that, by properly selecting amplitude and phase of C, $\Gamma_T$, G and Sij we can adjust $\Gamma_{load}$ to reach or exceed 1. To reach this simplified, though representative, relation we assumed the spurious couplings into the isolated ports of the wave-probe or the fixed coupler to be negligible. All this is not exactly true, but it is useful for estimating orders of magnitude. An exact calculation can be carried through, as shown later in this application, but does not alter the scope of the invention. Exact computations are carried through in matrix form in computer processor using exact calibration data acquired using s-parameter measurements as will be disclosed later. The simple relations are though representative enough and lead to useable results because the amplitudes and phases of the overlapping vectors are easily adjustable. What is important here is the capability of the system to adjust the returning signal by easily adjusting the coupling factor C and pre-tune to the desired points using a combination of coupler/active loop phase and dynamic tuning $\Gamma_T$. This, no hitherto solution can do as effectively.

Figure 10:
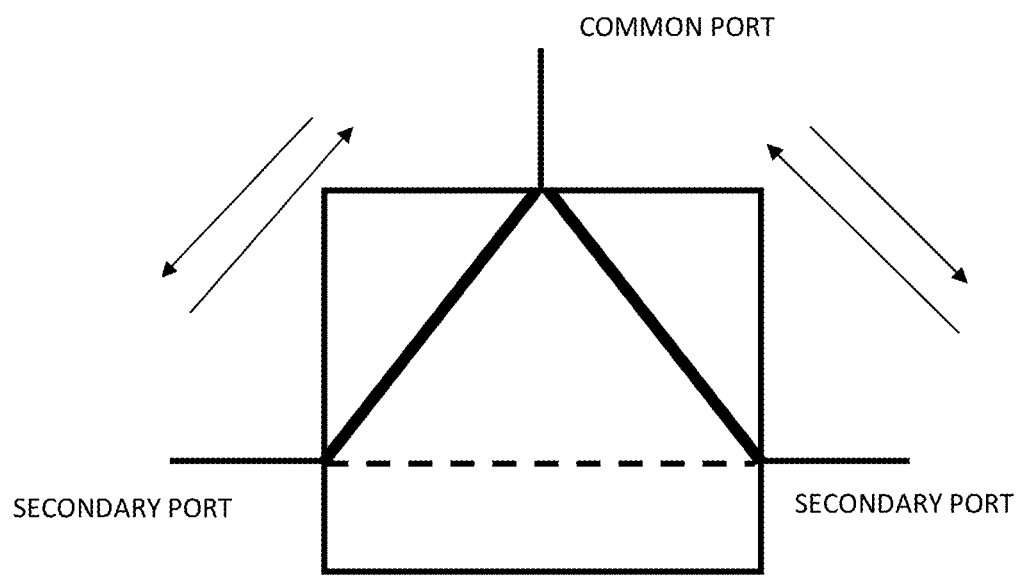
FIG. 10 depicts prior art, port definition and signal flow in a power combiner/divider.

The distinct advantage of this invention lies in the fact that it discloses a three harmonic active tuner that offers instantaneous, i.e. without hardware modifications, a frequency range of several octaves (1 octave=Fmax:Fmin=2:1). The only actual limitation is the availability of commercially available wideband power amplifiers, a situation in continuous evolution (see ref. 10). Other solutions, those using circulators (see ref. 13) or frequency triplexers (see ref. 14) suffer from the fundamental limitation of the bandwidth of circulators exceeding barely one octave and triplexers not exceeding a few hundred MHz. Amplifiers exist, meanwhile, from 0.8 to 18 GHz or up to 67 GHz (see ref. 10). If the output power of wideband amplifiers is insufficient, they can easily be combined in pairs using input power dividers and output power combiners (FIG. 10).

Figure 11:
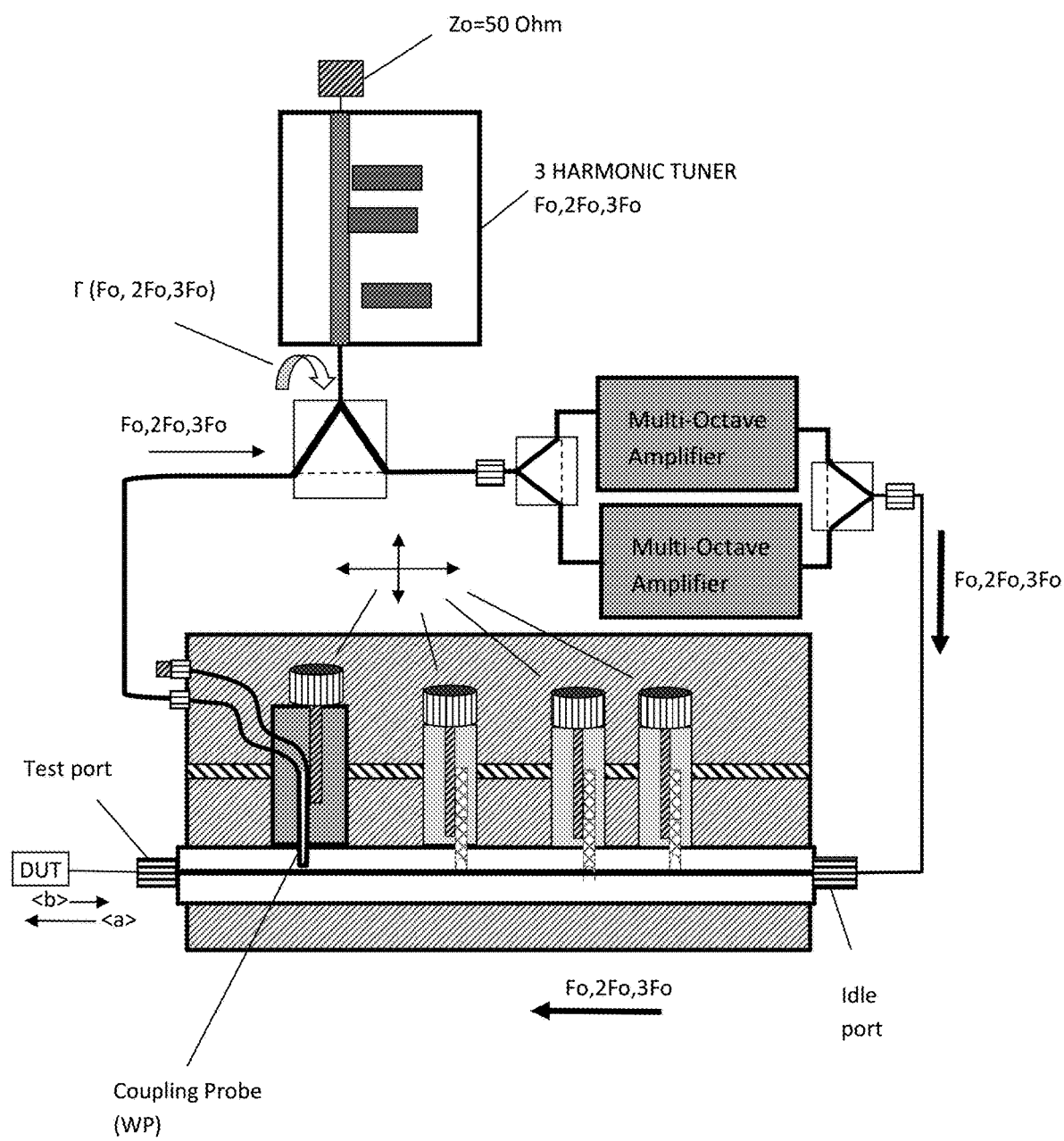
FIG. 11 depicts the hybrid tuner using a set of parallel wideband amplifiers for increased feedback power.
Figure 12:
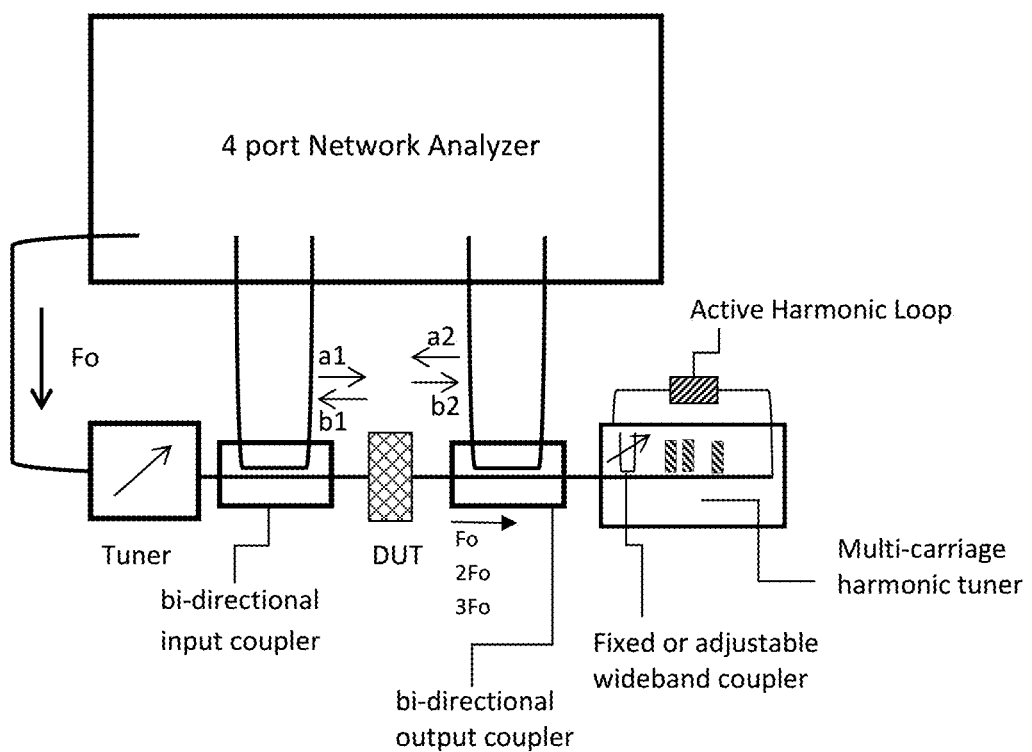
FIG. 12 depicts measurement setup for incident and reflected wideband power waves to the DUT, allowing time domain wave reconstruction.

Active tuners can be pre-calibrated, but the validity of a calibration made using small signal power in the range of a few milli Watt, depends, ultimately on the power generated by the DUT in real operation, since, when part of it is injected into the feedback amplifier, it may drive the amplifier into compression and affect its gain and transmission phase. In the particular case of the hybrid tuner this is a lesser concern, since, most of the reflected signal <a> (i.e. the portion <b>*(1−C)*S11 in FIG. 5) is created by the passive electro-mechanical pre-matching tuner #2, which remains linear also at high power. A pre-calibration is therefore useful mainly as a means to pre-tune. The actual impedance seen by the DUT shall be measured "in situ", as shown in FIG. 11. If the amplifier in the active harmonic loop is driven too hard into saturation and non-linearity and the impedances drift significantly the tuning may be lost and shall be corrected using back-tuning. In the setup of FIG. 11 each tone of the injected harmonic signal is sampled by the input bidirectional coupler: Power wave <a1> goes into the DUT and power wave <b1> is reflected. Equivalent at the output, power wave <b2> is extracted from the DUT and <a2> injected back, creating the load reflection factor $\Gamma_{load}=<a2>/<b2>$. The active tuner retrieves a portion of <b2> via the wave-probe, phase-adjusts and amplifies it using the harmonic tuner 59, which controls up to three harmonic impedances, in the active loop and injects it back. The same for all harmonic components <bi>, whereby <bi>=<b(i*Fo)>, i=1, 2, 3. Since we deal here only with output quantities <b2>=<b> and <a2>=<a>.

Tuner calibration is the procedure, by which two-port scattering (s-) parameters of the tuner are measured using a pre-calibrated vector network analyzer (VNA), see ref. 15, for a multitude of tuner states (tuning probe positions), saved in a calibration file, retrieved during measurement and used to associate the various measured DUT data with the corresponding impedance (reflection factor) generated by the tuner, and used to create ISO contours etc. The tuner controls independently at least three harmonic frequencies. It must therefore be calibrated at all those frequencies Fo, 2Fo and 3Fo. Harmonic multi-carriage slide screw tuners (see ref. 3) can generate billions of tuner states, which is the method of choice allowing independent wideband harmonic tuning by finding appropriate settings amongst the large impedance alternatives. The large number of billions of tuning states is created by permutations of the tuning states of each tuning probe. If each tuning probe creates 1000 states, the three create $1000^3=1$ billion states. In fact, slide screw tuners create, because of high mechanical positioning resolution, millions of states for each probe, because they have at least 5000 distinct horizontal probe positions and 2000 distinct vertical positions, resulting to 10 million states per probe, or $10^{18}$ in total for the three independent probes per frequency. These states are accessible only through two-dimensional interpolation among properly distributed calibration points, and have proven sufficient to ensure accurate wideband (not resonant) independent harmonic tuning (see ref. 3).

Figure 6:
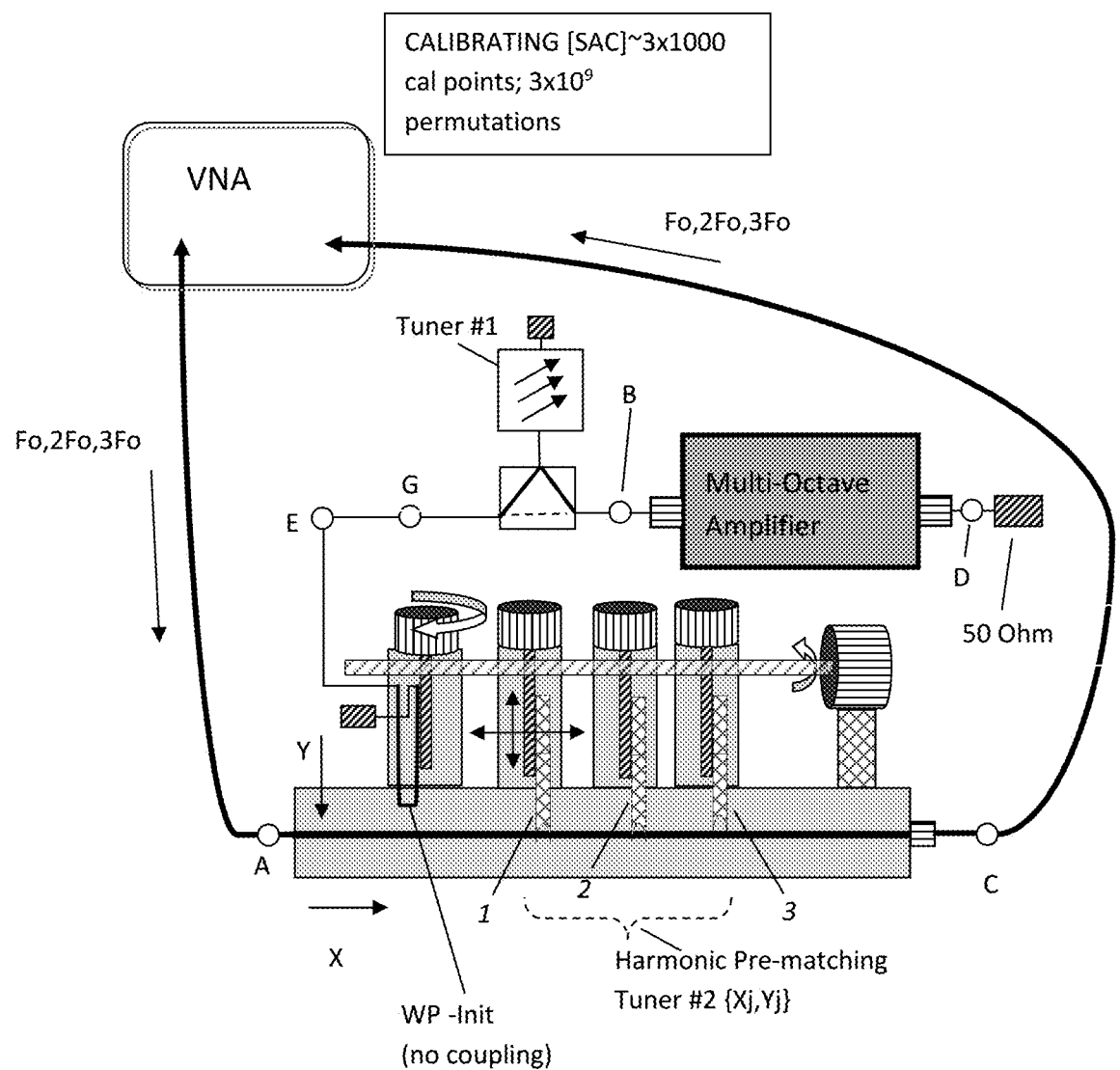
FIG. 6 depicts setup for calibrating the harmonic pre-matching tuner.

It is obvious that the tuners cannot be calibrated for each of the huge amount of possible states. Instead each of the two tuners #1 and #2 is calibrated for (typically) 3×1000=3000 states (see ref. 16), 1000 states for each tuning probe. The tuners are calibrated separately, each including the associated circuitry (FIGS. 6, 7 and 8) and the s-parameters are de-embedded, as follows: The pre-matching path, comprising the harmonic tuner #2, is calibrated in a setup as shown in FIG. 6: The VNA cables are connected to ports A and C, wherein port A is the input port of the signal coupler and C the output port of the slabline and the coupler is cascaded with the slabline: The wave probe (WP) is withdrawn (initialized) not retrieving any power or creating any reflection. If, in an alternative embodiment, a fixed coupler is used, it is part of the calibration, but its coupling must be measured separately. Then the s-parameters of the tuner between ports A and C are measured first, with all tuning probes 502 withdrawn, and saved in an init matrix [S0AC] at the three harmonic frequencies Fo, 2Fo and 3Fo. Following that, s-parameters of the tuner A-C are measured for typically 1000 probe positions of each tuning probe separately while the remaining two probes are withdrawn (initialized). The tuner #2 s-parameters between ports A and C, associated with the horizontal and vertical positioning of the second and third probe (first probe is the one closest to port A) are cascaded with the invers matrix [S0AC] i.e. $[S0AC]^{-1}$ and the s-parameters associated with the first probe are saved unmodified. Then all s-parameter matrices are saved for the three harmonic frequencies.

Figure 8:
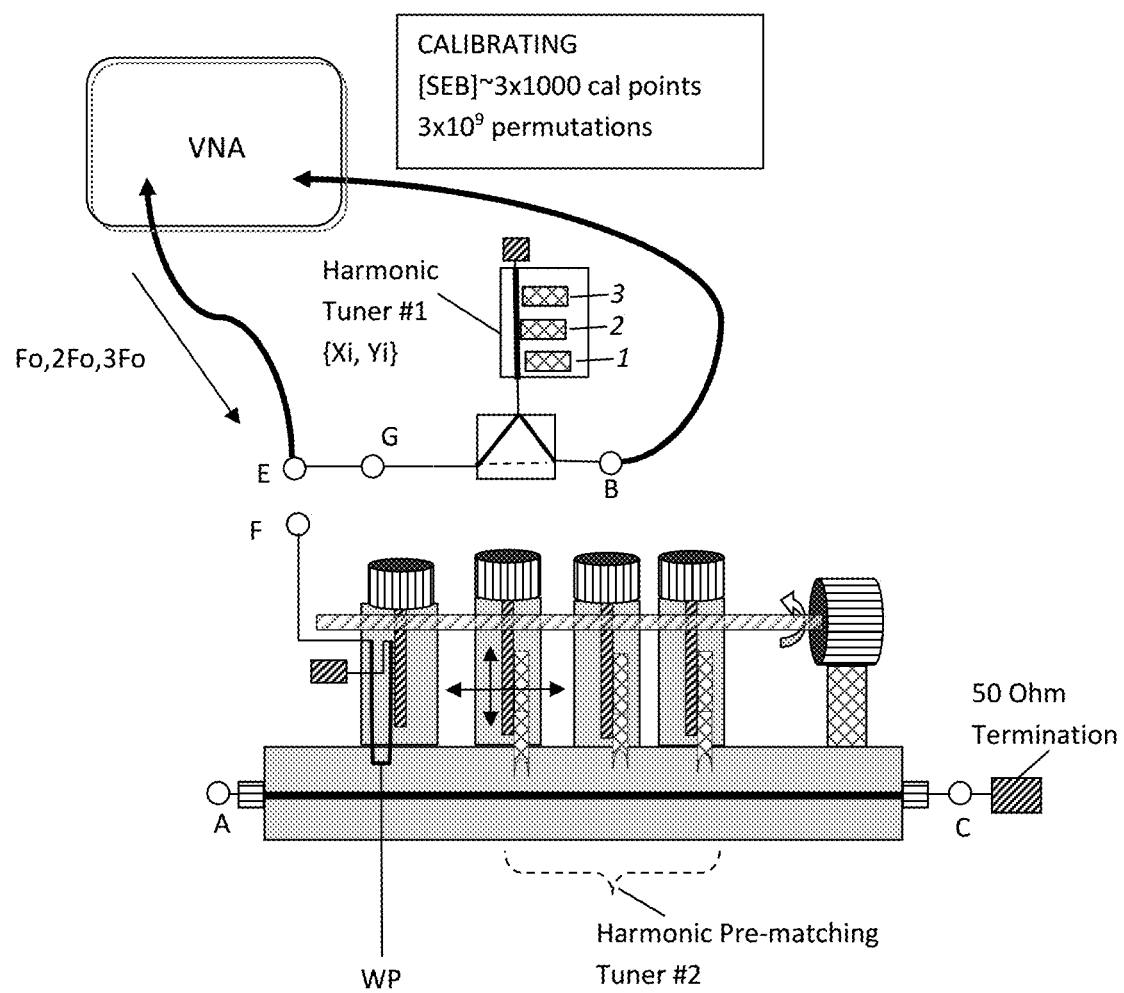
FIG. 8 depicts setup for calibrating the harmonic feedback path.

Tuner #1, in the active feedback tuner path, is calibrated between ports E and B (FIG. 8); All three tuning probes are independently controlled and shall be treated the same way as the three independent probes of tuner #2; in a first step, again, all tuning probes of tuner #1 are withdrawn (initialized). Subsequently the initialization matrix [S0EB] is measured and saved. All operations are executed equally for all harmonic frequencies, as before. Following this step s-parameters are measured of the tuner two port E-B, moving horizontally and vertically each tuning probe at a time and keeping all other probes initialized and s-parameters of tuning probes 2 and 3 (probe 1 is closest to port E) are de-embedded (cascaded with the invers matrix $[S0EB]^{-1}$). Subsequently the permutations of the s-parameters of all tuning probes are generated in computer memory and saved.

The s-parameters of the amplifier [SBD] are measured separately between ports B and D (FIG. 7) and saved for cascading a-posteriori with the tuner #1 s-parameters between ports E and B.

Figure 7:
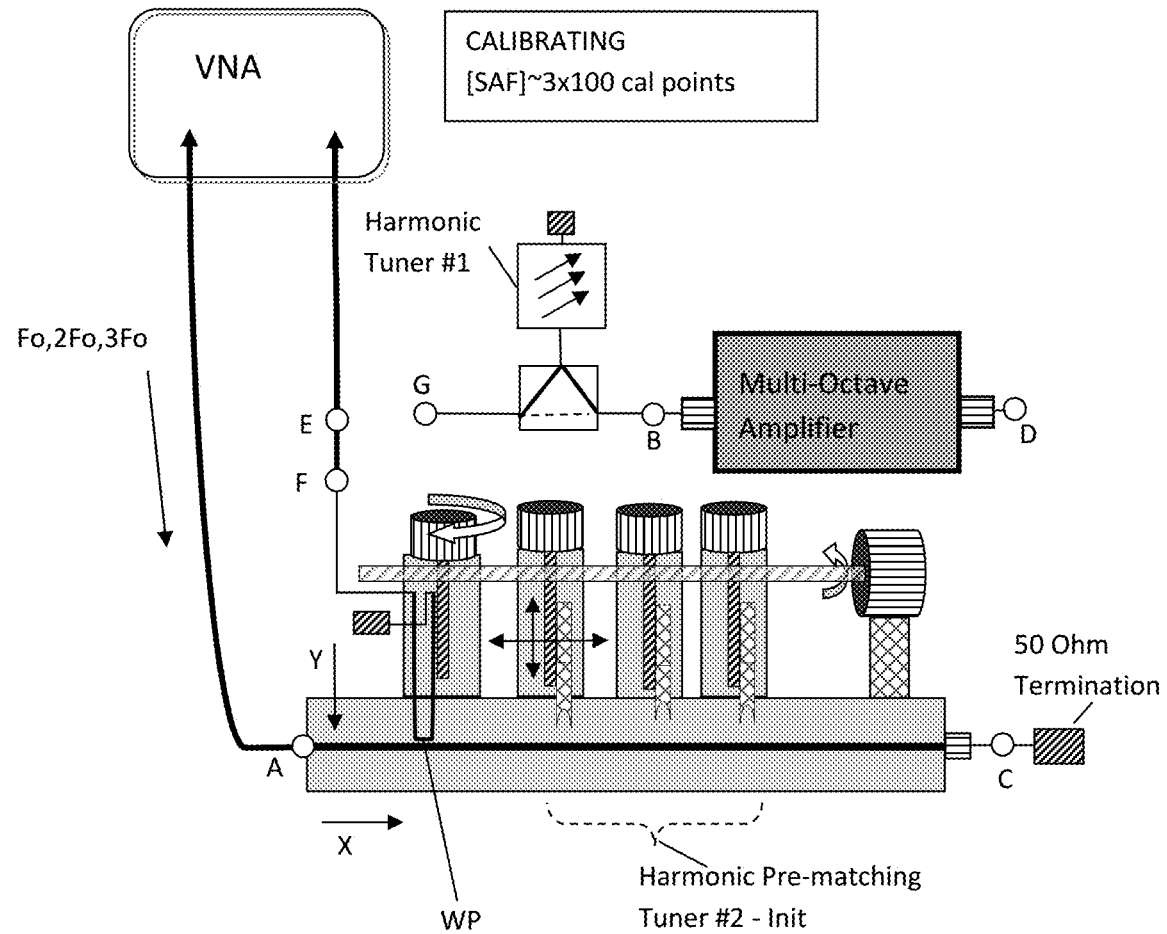
FIG. 7 depicts setup for calibrating the signal coupler (shown here for the adjustable wave-probe).

The signal coupler is calibrated by measuring s-parameters between ports A and F (FIG. 7). Because of limited isolation S32 between the coupled port and the output port of the coupler (FIG. 4) the coupling factor between ports A and F depend on the tuning state of tuner #2. For a fixed coupler the s-parameters [SAF] between ports A and F must be measured for a multitude of settings of the first probe of tuner #2 (best choice for post-processing are the same settings as in tuner #2 calibration). This corresponds to a multitude of s-parameters for horizontal and vertical positions of the first probe of tuner #2, that can be retrieved for post-processing for any impedance created by tuner #2 either using a single or multiple probes, the reason being that it is irrelevant how the impedance is created, as long as it is part of the calibration.

For an adjustable coupler the situation is more complex, because the coupling factor depends both on tuning of tuner #2 and movement of the coupling probe. Theoretically one would need N×M measurements, whereby N is the number of settings of the first probe of the tuner #2 and M the number of settings of the coupling probe. This can be a very big number if N=1000 and M=100. This can be bypassed using a realistic approximation and measuring s-parameters between ports A and F (coupling) in FIG. 7 and ports F and C (isolation). In this case the approximation formula SAF'≈SAF+SFC*S11 {eq. 9}, see ref. 18, is used, wherein S11 is known from tuner #2 calibration and SAF and SFC are the corresponding elements of the associated s-parameter matrices [SAF]={SAA, SAF, SFA, SFF} and [SFC]={SFF, SFC, SCF, SCC} and are calibrated directly; in the above case N=1000, M=100 this corresponds to 200 supplementary measurements (two sets of M=100 coupling probe settings), the rest being computer generated. For subsequent computations the overall s-parameter matrix [SAF]' is extended by adding the coupler and the amplifier two-ports as follows: [SAF]'=[SAF]'×[SEB]×[SBD]. The internal port G in FIGS. 6 to 9 is used only to show the separation of the calibrating two-ports and not referred to explicitly.

The calibration algorithms thus execute following the steps: A.1 to F.1 for the feedback loop including tuner #1 and A.2 to F.2 for the pre-matching tuner #2:
A.1 connect pre-calibrated VNA to ports E and B; terminate with 50Ω the output port of tuner #1; (FIG. 8); the calibration executes as follows:
B.1 withdraw all tuning probes of tuner #1;
C.1 measure s-parameters between ports E and B and save [S0EB] for each harmonic frequency;
D.1 measure s-parameters between ports E and B associated with a multitude of horizontal and vertical positions of each tuning probe individually, the remaining two tuning probes being withdrawn, and save.
E.1 cascade $[S0EB]^{-1}$ with s-parameters associated with positioning tuning probes 2 and 3 for each harmonic frequency and save s-parameters of all probes; probe 1 is closest to port E;
F.1 create in computer memory all permutations of s-parameters associated with all probes, and save.

For pre-matching (PM) tuner #2 the calibration is as follows (FIG. 6):
A.2 connect pre-calibrated VNA to ports A and C;
B.2 withdraw WP;
C.2 measure s-parameters between ports A and C and save [S0PM] for all harmonic frequencies;
D.2 place probes 1, 2, 3 alternatively to multiple horizontal and vertical positions {Xij, Yik} and measure s-parameters Si,jk(n*Fo), wherein i=1, 2, 3, {j,k}={1,2}, n=1, 2, 3, wherein the non-moving probes are at Xi=Yi=0 (withdrawn, initialized);
E.2 cascade $[S0PM]^{-1}$ of step C.2 with s-parameters of probes 2 and 3;
F.2 create all permutations for the settings of the three probes for each harmonic frequency and save.

Figure 13:
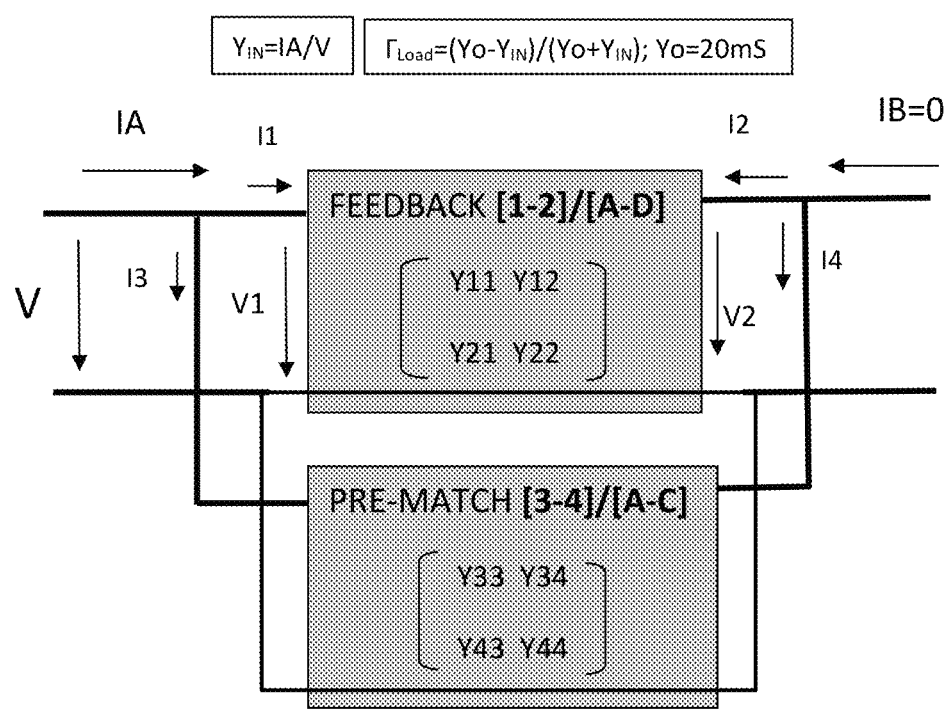
FIG. 13 depicts Y (admittance)-parameter representation of the hybrid tuner.

The amplifier two-port s-parameters are cascaded with the s-parameters of the block associated with tuner #1, creating the feedback path described by s-parameters [SFB]. The calibration of tuner #2 generates the pre-matching block with s-parameters [SPM]. To calculate accurately the impedance presented to the DUT at port A we treat block FB and block PM as parallel two-ports. In this case the Y parameters are processed as shown in FIG. 13. The relations extracted from FIG. 13 are:

$$Y_{IN}=IA/V \qquad \{eq.2\};$$

$$V1=V \qquad \{eq.3\};$$

$$IB=I2+I4=0 \qquad \{eq.4\};$$

$$I1=Y11*V1+Y12*V2 \qquad \{eq.5\};$$

$$I2=-I4=Y21*V1+Y22*V2 \qquad \{eq.6\};$$

$$I3=Y43*V1+Y44*V2 \qquad \{eq.7\}, \text{ leading to}$$

$$Y_{IN}=IA/V=(Y11+Y33)-(Y21+Y43)/(Y22+Y44)*(Y12+Y34) \qquad \{eq.8\}.$$

Y-parameters of block A-D i.e. {Y11,Y12,Y21,Y22} are calculated using s-parameters [SAF], Y-parameters of block A-C i.e. {Y33,Y34,Y43,Y44} are calculated from s-parameters [SAC], using known formulas (see ref. 17). This allows calculating from the value of Y the reflection factor $\Gamma_{load}$ at port A, presented to the DUT (FIG. 13).

This application discloses the concept of a multi-octave hybrid load pull tuner and its calibration. Obvious alternatives shall not impede on the originality of the concept.

What I claim as my invention is:
1. A multi-octave hybrid harmonic load pull tuner, having a test port, comprises:
 a directional signal coupler having input, output, coupled and isolated ports,
 a power combiner/divider having one common and two secondary ports, a first secondary port and a second secondary port,
 two multi-carriage harmonic impedance tuners #1 and #2 each having an input port and output port,
 an amplifier having input port and output port,
 RF cables and characteristic impedance Zo equal to 50 Ohm terminations;
 wherein
  the test port of the load pull tuner is the input port of the directional signal coupler; the directional signal coupler is cascaded with the tuner #2;
  the coupled port of the directional signal coupler is connected with the first secondary port of the power combiner/divider;

the common port of the power combiner/divider is connected with the input port of the tuner #1; the second secondary port of the power combiner/divider is connected with the input port of the amplifier;

the output port of the amplifier is connected with the output port of the tuner #2; the input port of the tuner #2 is connected with the output port of the directional signal coupler;

the output port of the tuner #1 and the isolated port of the directional signal coupler are terminated with the characteristic impedance.

2. The multi-octave hybrid harmonic load pull tuner of claim 1,
wherein
the tuners #1 and #2 are automatic multi-carriage slide screw impedance tuners comprising:
a slabline between the ports,
a multitude of remotely controlled mobile carriages sliding along the slabline, each said carriage having a remotely controlled vertical axis, on which is attached a metallic tuning probe, insertable into the slot of the slabline.

3. The multi-octave hybrid harmonic load pull tuner of claim 1,
wherein
the signal coupler is an adjustable wave-probe integrated in a slabline of the tuner #2 between the test port and a mobile carriage closest to the test port.

4. The mutli-octave hybrid harmonic load pull tuner of caim 3,
wherein
the adjustable wave-probe comprises electro-magnetic coupling probe, which is insertable into the slot of the slabline and is attached to a vertical axis of a remotely controlled mobile carriage sliding along the slabline.

5. The multi-octave hybrid harmonic load pull tuner of claim 1,
wherein
a second amplifier is added in parallel with the amplifier.

6. A calibration method for the multi-octave hybrid harmonic load pull tuner, as in claim 3 comprising four steps:
step 1) calibration of a feedback tuner path, comprising:
a) disconnect the secondary ports of the combiner/divider from the directional signal coupler and the amplifier;
b) connect the secondary ports of the combiner divider to a pre-calibrated VNA;
c) initialize (withdraw) all tuning probes of the tuner #1;
d) measure the initialization matrix saved as [S0FB] at all harmonic frequencies;
e) measure s-parameters for a multitude of horizontal and vertical positions of:
each tuning probe individually, the remaining probes remaining initialized;
f) cascade the s-parameters associated with all tuning probes, except for the s-parameters associated with the first tuning probe, with [S0FB]$^{-1}$ wherein the first probe is closest to the input port of the tuner #1;
g) cascade all permutations of s-parameters associated with all tuning probes at all harmonic frequencies and save;

step 2) calibration of a pre-matching path, comprising:
h) disconnecting the amplifier;
i) connecting the VNA to the input port of the directional signal coupler and to the output port of the slabline;
j) withdraw the adjustable wave-probe;
k) withdraw all tuning probes of the tuner #2;
l) measure the initialization matrix saved as [S0PM] at all harmonic frequencies;
m) measure s-parameters at all harmonic frequencies for a multitude of horizontal and vertical positions of each tuning probe individually, the remaining probes remaining withdrawn;
n) cascade the s-parameters of all tuning probes, except of the first probe, with the inverse matrix [S0PM]$^{-1}$, wherein the first probe is closest to the input port of the tuner #2;
o) cascade all permutations of s-parameters associated with all tuning probes at all harmonic frequencies and save;

step 3) calibration of the adjustable wave-probe, comprising:
p) connect the VNA between the input port and the coupled port of the directional signal coupler;
q) initialize all tuning probes of the tuner #2;
r) terminate the output port of the slabline of the tuner #2 with characteristic impedance;
s) measure s-parameters at all harmonic frequencies for a multitude of horizontal and vertical positions of the coupling probe of the adjustable wave-probe and save;

step 4) calibration of the amplifier comprising:
connect the VNA to the input and output ports of the amplifier;
measure s-parameters at all harmonic frequencies and save.

7. The multi-octave hybrid harmonic load pull tuner of claim 1,
wherein
the directional signal coupler is fixed, integrated in and cascaded with a slabline of the tuner #2.

8. A calibration method for the multi-octave hybrid harmonic load pull tuner, as in claim 3 comprising four steps:
step 1) calibration of a feedback tuner path, comprising:
a) disconnect the secondary ports of the combiner/divider from the directional signal coupler and the amplifier;
b) connect the secondary ports of the combiner divider to a pre-calibrated VNA;
c) initialize (withdraw) all tuning probes of the tuner #1;
d) measure the initialization matrix named [S0FB] at all harmonic frequencies;
e) measure s-parameters for a multitude of horizontal and vertical positions of each tuning probe individually, the remaining tuning probes remaining initialized;
f) cascade the s-parameters associated with all tuning probes, except for the s-parameters associated with the first tuning probe, with [S0FB]$^{-1}$ wherein the first tuning probe is closest to the input port of the tuner #1;
g) cascade all permutations of s-parameters associated with all tuning probes at all harmonic frequencies and save;

step 2) calibration of a pre-matching path, comprising:
h) disconnect the amplifier;
i) connect the VNA to the input port of the directional signal coupler and to the output port of the slabline;

j) withdraw the adjustable wave-probe;
k) withdraw all tuning probes of the tuner #2;
l) measure the initialization matrix saved as [S0PM] at all harmonic frequencies;
m) measure s-parameters at all harmonic frequencies for a multitude of horizontal and vertical positions of each tuning probe individually, the remaining probes remaining withdrawn;
n) cascade the s-parameters of all tuning probes, except of the first probe, with the inverse matrix $[S0PM]^{-1}$,
wherein the first probe is closest to the input port of the tuner #2;
o) cascade all permutations of s-parameters associated with all tuning probes at all harmonic frequencies and save;

step 3) calibration of the adjustable wave-probe, comprising:
p) connect the VNA between the input port and the coupled port of the directional signal coupler;
q) initialize all tuning probes of the tuner #2;
r) terminate the output port of the slabline of the tuner #2 with characteristic impedance;
s) measure s-parameters at all harmonic frequencies for a multitude of horizontal and vertical positions of the first tuning probe of the tuner #2 and save.

step 4) calibration of the amplifier comprising:
connect the VNA to the input and output ports of the amplifier;
measure s-parameters at all harmonic frequencies and save.

* * * * *